United States Patent [19]

Chiu et al.

[11] Patent Number: 5,401,998
[45] Date of Patent: Mar. 28, 1995

[54] TRENCH ISOLATION USING DOPED SIDEWALLS

[76] Inventors: Kuang Y. Chiu, 12882 Viscaino Rd., Los Altos Hills, Calif. 94022; Dan W. Peters, 3470 Bruckner Cir., Mountain View, Calif. 94040

[21] Appl. No.: 296,611

[22] Filed: Aug. 26, 1994

Related U.S. Application Data

[63] Continuation of Ser. No. 984,805, Dec. 3, 1992, abandoned.

[51] Int. Cl.⁶ .............................................. H01L 27/04
[52] U.S. Cl. ................................... 257/368; 257/515; 257/519; 257/521; 257/648
[58] Field of Search ............... 257/515, 519, 521, 648, 257/368

[56] References Cited

U.S. PATENT DOCUMENTS

| | | | |
|---|---|---|---|
| 4,498,227 | 2/1985 | Howell | 257/519 |
| 4,507,849 | 4/1985 | Shinozaki | 257/521 |
| 4,660,278 | 4/1987 | Teng | 29/576 |

OTHER PUBLICATIONS

B. Davari et al., "A Variable-Size Shallow Trench Isolation (STE) Technology With Diffused Sidewall Doping For Submicron CMOS," IEDM 88, pp. 92-95. Jan. 1988.

G. Fuse, et al., "A Practical Trench Isolation Technology With A Novel Planarization Process," IEDM 87, pp. 732-735. Jan. 1987.

*Primary Examiner*—Edward Wojciechowicz

[57] ABSTRACT

A P-type substrate is immersed in a solution of potassium hydroxide (KOH) which etches exposed portions of the substrate to form trenches with sidewalls at an angle of 54.7 degrees with respect to the top surface of the substrate. A vertical boron implant is then conducted which implants boron ions into the angled sidewalls of the trenches. A layer of oxide is then deposited over the substrate surface to fill the trenches approximately flush with the surface of the substrate. NMOS transistors may then be formed in the islands surrounded by the trenches so as to be isolated from other NMOS devices. The boron doping of the sidewalls prevents the inversion of the sidewalls due to any charged contaminants in the deposited oxide. This avoids parasitic leakage currents between the N-type source and drain regions of the NMOS transistors which abut the sidewalls of the trenches.

6 Claims, 3 Drawing Sheets

TRENCH ISOLATION USING DOPED SIDEWALLS

CROSS-REFERENCE TO RELATED APPLICATION

This is a continuation of application Ser. No. 07/984,805, filed on Dec. 3, 1992, now abandoned.

FIELD OF THE INVENTION

This invention relates to semiconductor devices and in particular to a method for isolating active devices in a semiconductor substrate.

BACKGROUND OF THE INVENTION

Numerous techniques have been used to isolate active devices (e.g. transistors, diodes) formed in a same semiconductor substrate. One technique is forming an active device in a well or tub which provides junction-isolation, whereby the well or tub is electrically isolated from adjacent areas by a reverse biased pn junction.

A very different type of isolation technique is to physically etch a trench in the semiconductor substrate, where this trench surrounds an active device. This trench isolation of an active device from other active devices outside the trench inherently results in a degree of electrical isolation between the active devices.

Trench isolation has been found advantageous in high density MOSFET applications, since these trenches can be predictably formed to submicron dimensions.

One problem which has been recognized in isolating MOS devices with trench isolation is the formation of a parasitic leakage path in a trench-isolated NMOS device due to the inversion of P-type trench sidewalls by positively charged contaminants in deposited oxide which fills the trenches. Deposited oxide is frequently contaminated with positive ions (such as sodium) which draw electrons in the P-type substrate to the P-type sidewalls of the trenches and thereby create an N-channel conducting path between the N-type source and drain regions of the NMOS transistor.

It is known to prevent this parasitic leakage path between the source and drain regions of an NMOS transistor by increasing the P-type doping concentration in the sidewalls of the trenches. Known techniques for doping the generally vertical sidewalls of the trenches include an angled field implant where P-type boron ions are implanted into the vertical trench-sidewalls at a large implantation tilt-angle. Such a process is described in the article entitled "A Practical Trench Isolation Technology with a Novel Planarization Process," by G. Fuse, et. al., IEDM 87.

Another method to dope the substantially vertical trench sidewalls is to deposit a P+ polysilicon or borosilicate glass (BSG) film into the trenches, where the boron in these films is then out-diffused into the sidewalls. This boron diffusion source may then be removed by a conventional etching process. The resulting P-type doping concentration in the sidewalls will thus prevent any parasitic leakage path between N-type source and drain regions along the sidewalls. Such a sidewall doping process using a deposited film is described in the article entitled "A Variable-Size Shallow Trench Isolation (STI) Technology with Diffused Sidewall Doping for Submicron CMOS," by B. Davari, IEDM 88.

Both the above doping techniques for the sidewalls of trenches have significant drawbacks. The tilted ion implantation technique described above produces nonuniform concentrations of dopants in the sidewalls of deep or narrow trenches, since the ion trajectories will be blocked by the surface of the wafer which surrounds the deep or narrow trenches. Further, in this tilted implantation process, opposing sidewall faces must be doped using opposite tilt angles, which requires shifting the angle of the ion beam relative to the wafer after one sidewall face is doped. The second method, using a deposited film as a P-type impurity diffusion source, requires additional and time-consuming steps to deposit the diffusion source, out-diffuse the impurities, and remove the diffusion source. Further, the resulting dopant concentration is difficult to accurately predict.

What is needed is a more reliable and faster method for etching trenches to isolate active devices and for doping the sidewalls of these trenches to prevent parasitic leakage currents between regions of an NMOS transistor.

SUMMARY OF THE INVENTION

In the preferred embodiment of the present invention, a P-type silicon substrate having a <100> crystal orientation is used for forming active devices therein. The surface of the substrate is masked to expose areas of the substrate in which trenches are to be etched for isolating active devices from one another. The substrate is then dipped in a solution of potassium hydroxide (KOH), which etches the exposed portions of the substrate to form trenches with angled sidewalls. The sidewalls are automatically formed at an angle of 54.7° with respect to the surface of the substrate due to the crystalline structure of the substrate. The depth of the trenches is simply controlled by the length of time the substrate is in contact with the KOH.

Once the trenches are etched to the desired depth, a vertical (0° tilt) boron implant is conducted which implants boron ions into the angled sidewalls of the trenches. Since all portions of the sidewalls are equally exposed to the boron ions, the ions are uniformly implanted in the sidewalls no matter how wide or deep the trenches.

After this boron implant process, a layer of oxide is then deposited over the substrate surface, filling the trenches. The oxide is then etched so as to only leave oxide within the trenches to a level approximately flush with the surface of the substrate.

NMOS devices may then be formed in the islands surrounded by the trenches so as to be isolated from other NMOS devices. The boron doping of the sidewalls prevents the inversion of the sidewalls due to any contamination of the deposited oxide. This avoids parasitic leakage currents between the N-type source and drain regions of the NMOS devices which abut the sidewalls of the trenches.

The above method is more reliable, faster, and simpler than previously known methods used to form trenches with doped sidewalls.

DETAILED DESCRIPTION OF THE PREFERRED EMBODIMENT

Figure 1A:
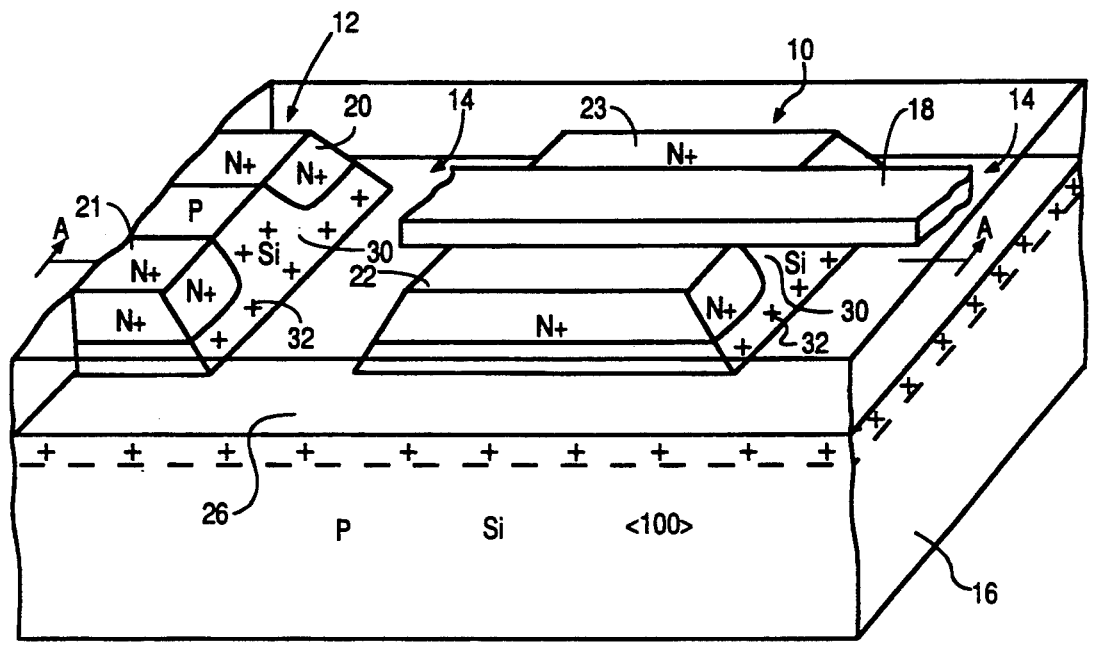
FIG. 1a is a perspective view of a portion of a wafer incorporating active devices isolated by trenches formed using the present invention.

FIG. 1a is a perspective view of a semiconductor wafer illustrating one embodiment of the invention where a first N-channel MOSFET (NMOS) 10 is isolated from a second NMOS device 12 by a trench 14. Trench 14 is formed in a P-type silicon substrate 16, where substrate 16 preferably has a <100> crystal orientation.

A conductive gate 18 for NMOS device 10 is partially shown. Gates for NMOS devices 10 and 12 are insulated from the N-type source and drain regions 20–23 of the NMOS devices 10 and 12.

A sufficiently positive voltage applied to the conductive gate 18 with respect to source 22 will cause current to be conducted between source 22 and drain 23. This is because the silicon substrate 16 is a P-type, and a positive voltage on gate 18 will cause negative charges to accumulate under gate 18 between source 22 and drain 23. The accumulation of negative charges in this channel region under gate 18 between N-type source 22 and N-type drain 23 causes a conductive path to be formed between source 22 and drain 23 so that current now flows between source 22 and drain 23. NMOS device 12 acts similarly with a suitable voltage applied to its gate to conduct current between source 21 and drain 20.

Trench 14 acts to isolate NMOS device 10 from NMOS device 12 so that these devices may be operated independently without affecting each other's operation.

When NMOS device 10 or 12 is switched off by a low voltage on their respective gates (e.g., gate 18), it is desired that no current now flow between their respective source and drain regions. Since the silicon substrate 16 is of a P-type, the channel region between the source and drain regions, such as source 21 and drain 20, is also a P-type and ideally acts to insulate the source and drain regions when the NMOS device 12 is off. However, trench 14 is filled with a deposited oxide layer 26 which typically contains positively charge contaminants, such as sodium. These positive ions in the oxide 26 tend to draw electrons in the silicon substrate 16 to the sidewalls 30 of trenches 14, which could potentially create an N-type ohmic channel between source 21 and drain 20 of NMOS device 12 and between source 22 and drain 23 of NMOS device 10. Such a parasitic inversion of sidewalls 30 would cause an undesirable leakage current between source 21 and drain 20 and between source 22 and drain 23.

To avoid these positive ions in oxide layer 26 from causing an inversion in the surface of the sidewalls 30, P-type boron ions 32 are implanted into the angled sidewalls 30. Accordingly, no leakage currents now flow in NMOS devices 10 and 12.

Figure 1B:
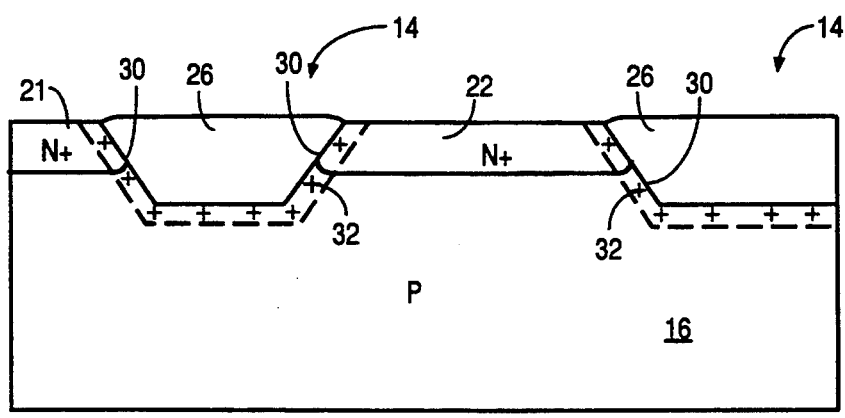
FIG. 1b is a cross-section of the wafer shown in FIG. 1a along line A—A.

FIG. 1b is a cross-section along line A—A in FIG. 1a which shows trenches 14 formed in substrate 16. Source 21 and source 22 are also shown.

Sidewalls 30 of trenches 14 are shown additionally doped with P-type boron ions 32, which cause sidewalls 30 to be slightly more doped than the P-type substrate 16. The positively charged contaminants in oxide 26 cannot now draw a sufficient number of electrons from substrate 16 to invert sidewalls 30, and thus sidewalls 30 retain their P-type conductivity when NMOS devices 10 and 12 (FIG. 1a) are switched to their off state.

The below-described method is a highly efficient process for forming sidewalls 30 at an angle with respect to the surface of substrate 16 to enable sidewalls 30 to be doped with boron ions using a simple, vertical ion implantation process. This process of forming trenches 14 and doping the resulting sidewalls 30 to avoid inversion of sidewalls 30 is the most reliable and efficient method of providing trench isolation known to date.

Figure 2:
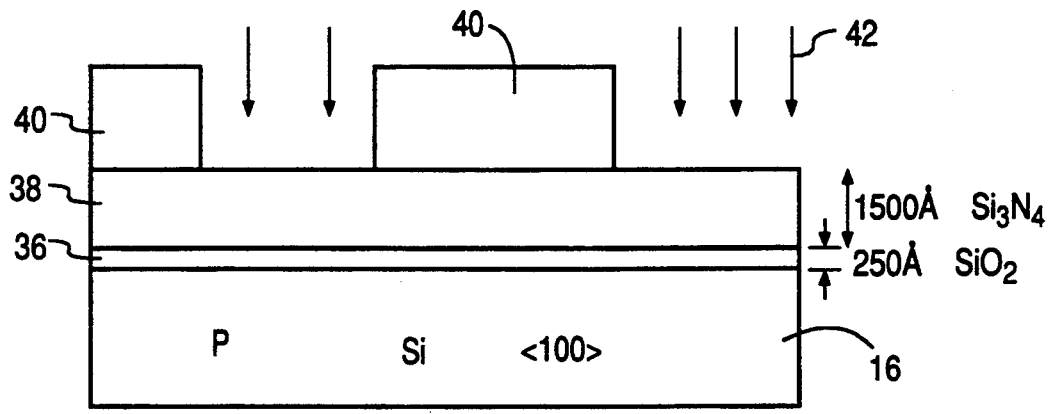
FIGS. 2–8 are cross-sectional views along line A—A in FIG. 1a of the wafer in various stages during the preferred process for forming isolation trenches with doped sidewalls.

FIG. 2 illustrates a starting silicon substrate 16 with a P-type conductivity and a crystal orientation of <100>.

For high performance applications, it may be desirable to form substrate 16 using a P+ substrate with a P-type epitaxial layer to protect against latch-up when CMOS devices are formed in the same substrate.

On the surface of substrate 16 is now formed a thin (250 Å) layer of oxide 36 using a conventional thermal oxidation process conducted at approximately 850° C. This oxide layer 36 will be used for stress relief, and its precise thickness is not significant.

Over oxide layer 36 is now formed a layer of silicon nitride ($Si_3N_4$) 38, using a conventional low pressure chemical vapor deposition (LPCVD) process, to a thickness of approximately 1500 Å.

Over nitride layer 38 is then spun-on a layer of resist 40, which is then masked, exposed, and developed to leave selected resist portions 40 remaining over nitride layer 38.

An anisotropic etch, illustrated by arrows 42, of nitride layer 38 is then conducted using a conventional plasma etching process.

Figure 3:
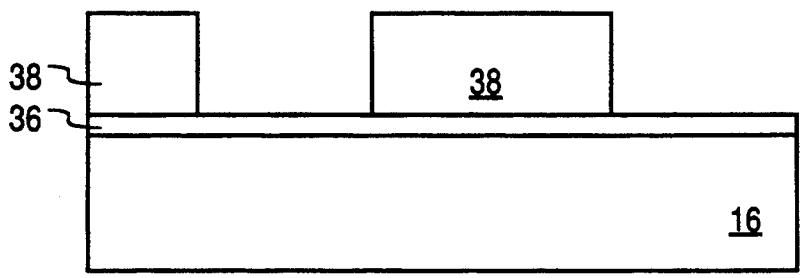

FIG. 3 shows the resulting substrate 16 after the exposed portions of nitride layer 38 have been etched down to oxide layer 36 and the resist portions 40 removed. The substrate 16 is then cleaned.

The areas of substrate 16 under the exposed portions of oxide layer 36 will next be etched away to form trenches for isolating subsequently formed active devices.

Figure 4:
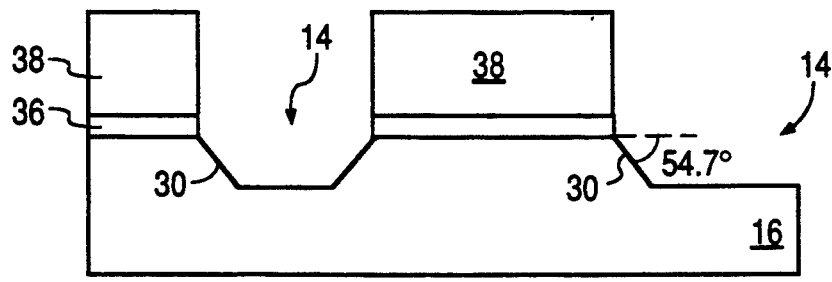

The wafer illustrated by FIG. 3 is immersed in a bath of potassium hydroxide (KOH) for etching the portions of substrate 16 not masked by nitride layer 38. Due to the crystalline structure of the silicon substrate 16, the KOH will automatically etch trenches 14 having a V-groove shape with sidewalls 30 forming an angle of approximately 54.7° with respect to the surface of substrate 16. This anisotropic etch by the KOH solution is shown in FIG. 4.

In one embodiment, trenches 14 are etched to a depth of approximately 2,000 Å (or 0.2 microns). Had substrate 16 been immersed long enough in the KOH bath, opposing sidewalls 30 would have intersected to form a V-groove. The optimum depth and width of trenches 14 are selected, in part, based upon the desired density of active devices and the extent of isolation required.

Figure 5:
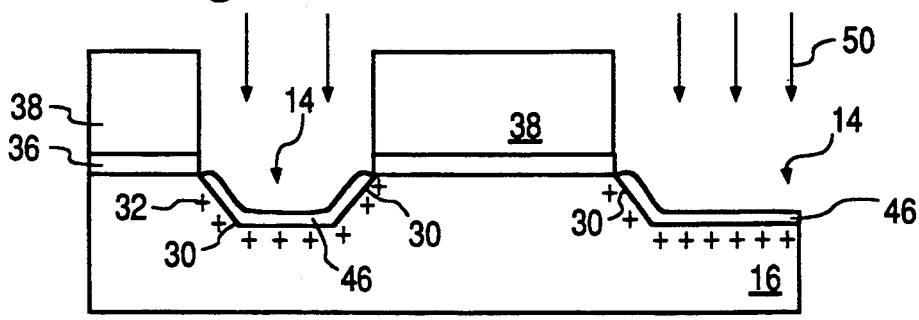

Next, as shown in FIG. 5, a thin (50 Å) layer of oxide 46 is grown over the exposed surfaces of substrate 16 (i.e., within trenches 14), using a conventional dry thermal process, in order to reduce channeling of ions during a subsequent ion implantation process. In one embodiment, this layer of oxide 46 is grown at a temperature of approximately 850° C.

Next, as shown in FIG. 5 by arrows 50, a boron ion field implant is then conducted at a substantially 0° tilt angle with respect to substrate 16. In one embodiment, the boron ions are implanted at an energy of 30 KeV with a dose of 6E12 ions/$cm^2$. The implantation of the P-type boron ions is shown by the positive charges 32 in substrate 16 surrounding trenches 14. This boron implantation step uniformly dopes sidewalls 30 of trenches 14 with P-type ions due to the shallow angle of sidewalls 30 with respect to the surface of substrate 16.

The formation of angled sidewalls 30 and the uniform doping of these sidewalls 30 using a vertical ion implant of boron ions constitutes a relatively simple process compared to the prior art processes previously described, while at the same time overcoming the stated drawbacks of those prior art processes. In the present process, trenches 14 can be made very narrow without any blockage of ions from nitride portions 38, unlike the prior art processes which tilt the ion beam in order to implant ions in substantially vertical sidewalls. Thus, the resulting dopant concentration in sidewalls 30 is relatively uniform and predictable. Further, the present process is much simpler and less time-consuming than the prior art processes. Additionally, as compared to prior art processes which dope substantially vertical sidewalls using a film as a boron diffusion source, the present process is considerably faster and the dopant concentration in sidewalls 30 may be more accurately controlled.

Referring back to FIG. 5, the thin layer of oxide 46 is then removed using, for example, an HF acid dip.

Figure 6:
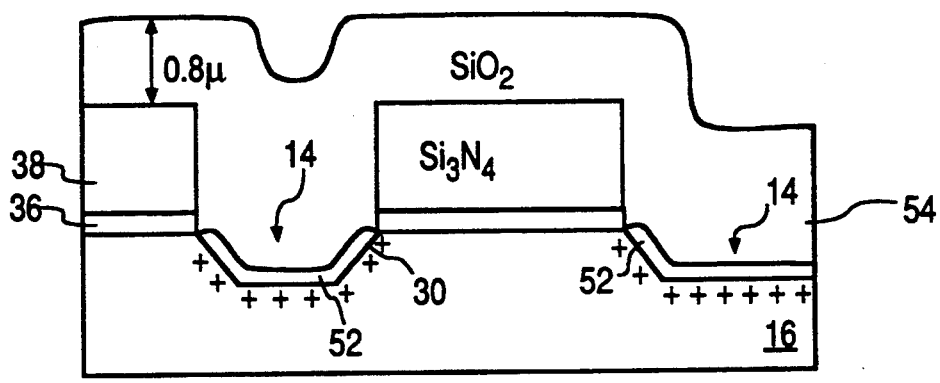

Next, as shown in FIG. 6, a layer of oxide 52 is then grown over the exposed portions of substrate 16 to a thickness of approximately 450 Å using a conventional thermal oxidation process conducted at about 850° C. Oxide 52 is grown to prevent contamination of silicon substrate 16 from a next layer of oxide 54 which will be subsequently deposited over the surface of the wafer.

A relatively thick (0.8 microns) layer of oxide 54 is then deposited over the surface of the wafer using any one of a number of conventional techniques, such as plasma deposition of oxide using a TEOS technique. Oxide 54 is then densified at approximately 900° C. for about 30 minutes in an atmosphere of nitrogen.

Figure 7:
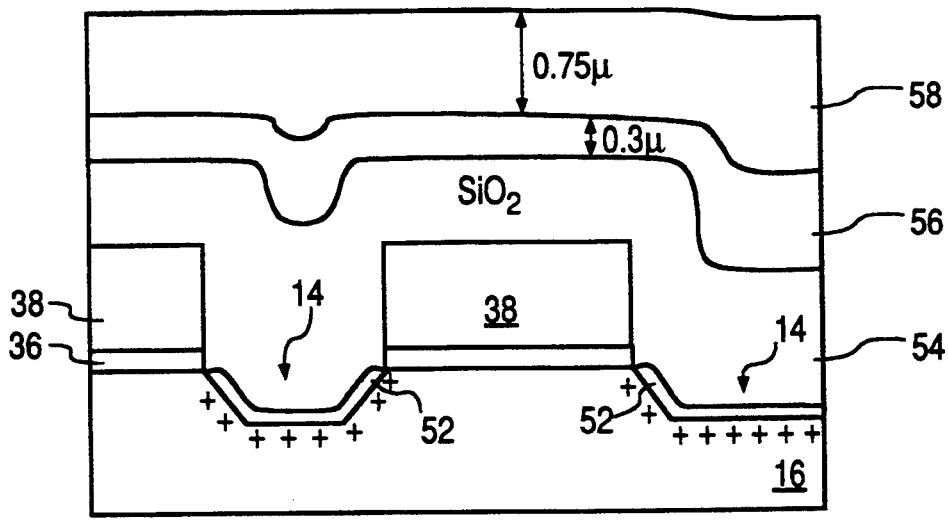

Next, as shown in FIG. 7, a first layer of resist 56 is spun-on to a thickness of approximately 0.3 microns. In order to flatten the top surface of resist 56, resist 56 is exposed to UV radiation for hardening, and the wafer is heated to flow resist 56.

A second layer of resist 58 is then spun-on to a thickness of approximately 0.75 microns. The second layer of resist 58 will not react with the first layer of resist 56 due to the previous UV exposure of resist 56. Resist 58 is then heated at approximately 200° C. for about an hour to flow resist 58 in order to flatten the top surface of resist 58. The resultant structure of FIG. 7 may now be more predictably etched due to the relatively flat top surface of resist 58.

Figure 8:
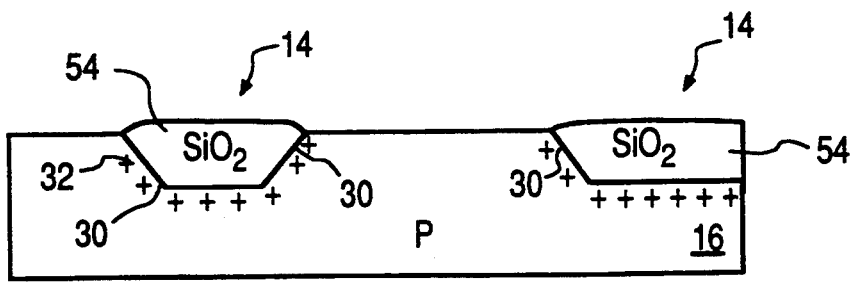

In the preferred embodiment, a two-step process is conducted to etch the top surface of the structure shown in FIG. 7 to achieve the resultant structure of FIG. 8. A first plasma etch is used to etch the top surface of the wafer of FIG. 7 down to a level where only oxide layer 54 and nitride layer 38 remain. In this first plasma etch, a LAM 4500 etcher is used with a gas mixture of Ar (160 sccm), CF$_4$ (10 sccm), CHF$_3$ (10 sccm), and O$_2$ (15 sccm). With this gas mixture, the etch rate of the resist 56 and 58 is roughly similar to the etch rate of the oxide 54. This first plasma etch is continued until there is no resist 56 remaining on the wafer.

A second plasma etch process is then used to etch nitride layer 38 and the remainder of the oxide 54 until oxide 54 is approximately flush with the surface of silicon substrate 16. The gas mixture used in one embodiment of this second plasma etch constitutes Ar (50 sccm) and CF$_4$ (15 sccm). Using this gas mixture, oxide 54 will etch at an etch rate of approximately twice that of nitride 38. Once oxide 54 is etched down to approximately flush with the surface of the silicon substrate 16, the etching is stopped, and the remaining nitride 38 on the surface of the wafer is then stripped off using a bath of hot phosphoric acid. The underlying oxide layer 36 is then stripped off in a bath of HF acid.

The wafer is cleaned after each of the above wet etching steps.

The resulting structure is shown in FIG. 8. The various elements shown in FIG. 8 have already been described.

Active devices, such as NMOS transistors 10 and 12 in FIG. 1a, may then be formed in the islands of the P-type substrate 16 using conventional processes.

Sidewalls 30 in trenches 14 of FIG. 8 are now sufficiently positively doped to prevent inversion of sidewalls 30 due to any positively charged contaminants in oxide 54 which now fills trenches 14. Thus, as previously described, NMOS devices 10 and 12 in FIG. 1a will not experience any leakage currents due to the inversion of sidewalls 30.

This invention is in no way limited to a specific geometry of trenches 14 or to the specific active devices which trenches 14 isolate, since this process may be advantageously used for any application where it is desired to simply and uniformly dope trench sidewalls.

Any materials equivalent to those described herein may be substituted.

While particular embodiments of the present invention have been shown and described, it will be obvious to those skilled in the art that claims and modifications may be made without departing from this invention in its broader aspects and, therefore, the appended claims are to encompass within their scope all such changes and modifications as fall within the true spirit and scope of this invention.

What is claimed is:

1. A semiconductor structure comprising:
  a silicon substrate of a P conductivity type;
  one or more trenches etched into a top surface of said substrate, said one or more trenches having angled sidewalls of said P conductivity type, said sidewalls forming an angle of between 50 and 60 degrees with respect to said top surface of said substrate, said sidewalls having P type ions implanted into them to increase a P type doping concentration along said sidewalls;
  an oxide layer filling said one or more trenches, said ions implanted into said sidewalls being sufficient to prevent inversion of said sidewalls due to any charged contaminants in said oxide; and
  one or more N-channel MOS transistors formed in said top surface of said substrate being isolated from other active devices by said one or more trenches, N-type source and drain regions of at least one of said MOS transistors terminating at a respective sidewall of one of said trenches, said ions implanted into said sidewalls preventing leakage currents from flowing between said source and drain regions due to positively charged ions in said oxide.

2. The structure of claim 1 wherein a crystal orientation of said substrate is <100>.

3. The structure of claim 1 wherein said trenches are anisotropically etched to form sidewalls having an angle of approximately 54.7 degrees with respect to said top surface of said substrate.

4. The structure of claim 3 wherein said trenches are etched using a potassium hydroxide (KOH) solution.

5. The structure of claim 1 wherein said trenches have a depth of approximately 0.2 microns.

6. The structure of claim 1 wherein said ions are implanted with a dose of approximately 6E12 ions/cm$^2$.

* * * * *